US010782885B1

(12) United States Patent
Patel

(10) Patent No.: US 10,782,885 B1
(45) Date of Patent: Sep. 22, 2020

(54) MEMORY INCLUDING SEARCH LOGIC

(71) Applicant: MICRON TECHNOLOGY, INC., Boise, ID (US)

(72) Inventor: Vipul Patel, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/374,188

(22) Filed: Apr. 3, 2019

(51) Int. Cl.
  G06F 12/00 (2006.01)
  G06F 3/06 (2006.01)
  G11C 16/04 (2006.01)
  G11C 16/08 (2006.01)
  G11C 16/26 (2006.01)

(52) U.S. Cl.
  CPC ............ *G06F 3/061* (2013.01); *G06F 3/0656* (2013.01); *G06F 3/0679* (2013.01); *G11C 16/0483* (2013.01); *G11C 16/08* (2013.01); *G11C 16/26* (2013.01)

(58) Field of Classification Search
  None
  See application file for complete search history.

(56) References Cited

U.S. PATENT DOCUMENTS

| 7,979,667 | B2 * | 7/2011 | Allen | G06F 12/0246 |
| | | | | 711/203 |
| 9,128,822 | B2 * | 9/2015 | Michael | G06F 12/0246 |
| 9,436,402 | B1 | 9/2016 | De Santis et al. | |
| 10,089,359 | B2 | 10/2018 | De Santis et al. | |

* cited by examiner

*Primary Examiner* — John A Lane
(74) *Attorney, Agent, or Firm* — Dicke, Billig & Czaja, PLLC

(57) ABSTRACT

A memory includes a memory array comprising a plurality of pages, a page buffer, and search logic. The page buffer includes first registers, second registers, compare logic, and third registers. The first registers store data read from a page of the memory array. The second registers store a user pattern. The compare logic compares the data stored in the first registers to the user pattern stored in the second registers. The third registers store the comparison results. The search logic is configured to identify addresses of the memory array where the comparison results stored in the third registers indicate a match between the data read from the page and column of the memory array and the user pattern. The first registers are loaded with data from a following page of the memory array concurrently with the search logic identifying addresses indicating a match in a previous page of the memory array.

21 Claims, 10 Drawing Sheets

| $270_0$ | $270_1$ | $270_2$ | $270_3$ |
|---|---|---|---|
| Block$_0$ $250_0$ | Block$_0$ $250_0$ | Block$_0$ $250_0$ | Block$_0$ $250_0$ |
| Block$_1$ $250_1$ | Block$_1$ $250_1$ | Block$_1$ $250_1$ | Block$_1$ $250_1$ |
| Block$_2$ $250_2$ | Block$_2$ $250_2$ | Block$_2$ $250_2$ | Block$_2$ $250_2$ |
| Block$_3$ $250_3$ | Block$_3$ $250_3$ | Block$_3$ $250_3$ | Block$_3$ $250_3$ |
| Block$_4$ $250_4$ | Block$_4$ $250_4$ | Block$_4$ $250_4$ | Block$_4$ $250_4$ |
| ⋮ | ⋮ | ⋮ | ⋮ |
| Block$_{L-4}$ $250_{L-4}$ | Block$_{L-4}$ $250_{L-4}$ | Block$_{L-4}$ $250_{L-4}$ | Block$_{L-4}$ $250_{L-4}$ |
| Block$_{L-3}$ $250_{L-3}$ | Block$_{L-3}$ $250_{L-3}$ | Block$_{L-3}$ $250_{L-3}$ | Block$_{L-3}$ $250_{L-3}$ |
| Block$_{L-2}$ $250_{L-2}$ | Block$_{L-2}$ $250_{L-2}$ | Block$_{L-2}$ $250_{L-2}$ | Block$_{L-2}$ $250_{L-2}$ |
| Block$_{L-1}$ $250_{L-1}$ | Block$_{L-1}$ $250_{L-1}$ | Block$_{L-1}$ $250_{L-1}$ | Block$_{L-1}$ $250_{L-1}$ |
| Block$_L$ $250_L$ | Block$_L$ $250_L$ | Block$_L$ $250_L$ | Block$_L$ $250_L$ |
| $240_0$ | $240_1$ | $240_2$ | $240_3$ |

MEMORY INCLUDING SEARCH LOGIC

TECHNICAL FIELD

The present disclosure relates generally to memory and, in particular, in one or more embodiments, the present disclosure relates to apparatus and methods for searching a memory array.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Applications using real time pattern recognition are increasing due to the increased use of artificial intelligence and machine learning, such a face recognition applications, license plate searching applications, etc. These applications may need large amounts of memory (e.g., greater than 1 TB) to store a database that a pattern can be compared against. In addition, these applications may need to identify matches quickly. NAND flash memory can provide a large storage capacity, however, searching a NAND flash memory may be slow due to the latency and input/output (I/O) speed of the NAND flash memory.

For the reasons stated above, and for other reasons stated below which will become apparent to those skilled in the art upon reading and understanding the present specification, there is a need in the art for alternative methods for searching a memory.

BRIEF DESCRIPTION OF THE DRAWINGS

FIGS. 2A-2D are schematic diagrams of portions of an array of memory cells as could be used in a memory device of the type described with reference to FIG. 1.

DETAILED DESCRIPTION

Figure 1:
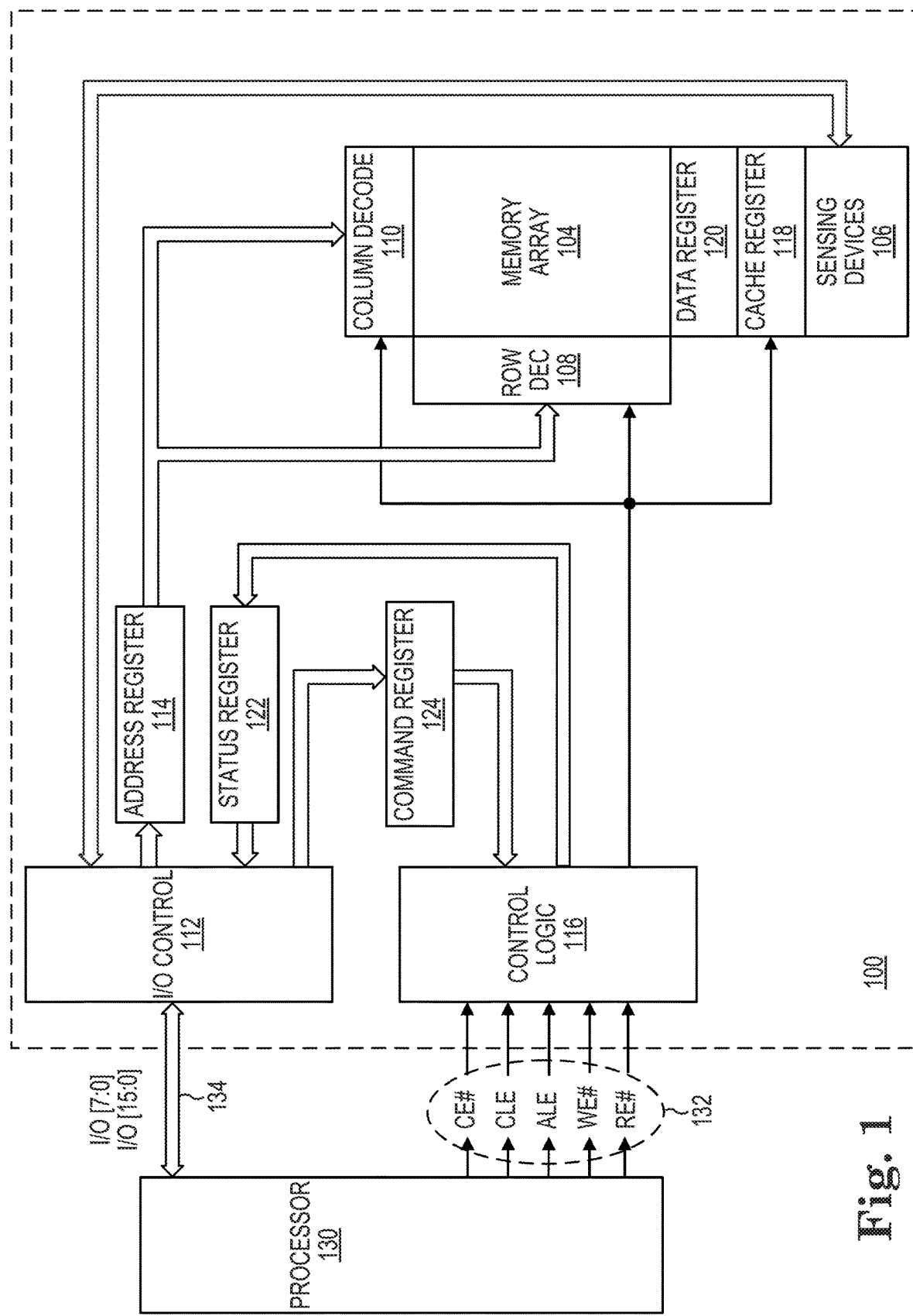
FIG. 1 is a simplified block diagram of one example of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Disclosed herein are methods and apparatus for searching a memory, such as a NAND memory. The memory includes internal search logic to perform the search with reduced (e.g., minimum) input/output (I/O) interaction. By reducing or minimizing the I/O interaction, the speed of the search may be increased. In addition, multiple memory arrays may be searched in parallel.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from sensing devices 106 to the cache register 118. The data is then passed from the cache register 118 to data register 120 for transfer to the array of memory cells 104; then new data is latched in the cache register 118 from sensing devices 106, which receive the new data from the I/O control circuitry 112. During a read operation, data is passed from the cache register 118 to sensing devices 106, which pass the data to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE #, a command latch enable CLE, an address latch enable ALE, a write enable WE #, and a read enable RE #. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118 through sensing devices 106. The data are subsequently written into data register 120 for programming the array of memory cells 104. For another embodiment, cache register 118 may be omitted, and the data are written directly into data register 120 through sensing devices 106. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
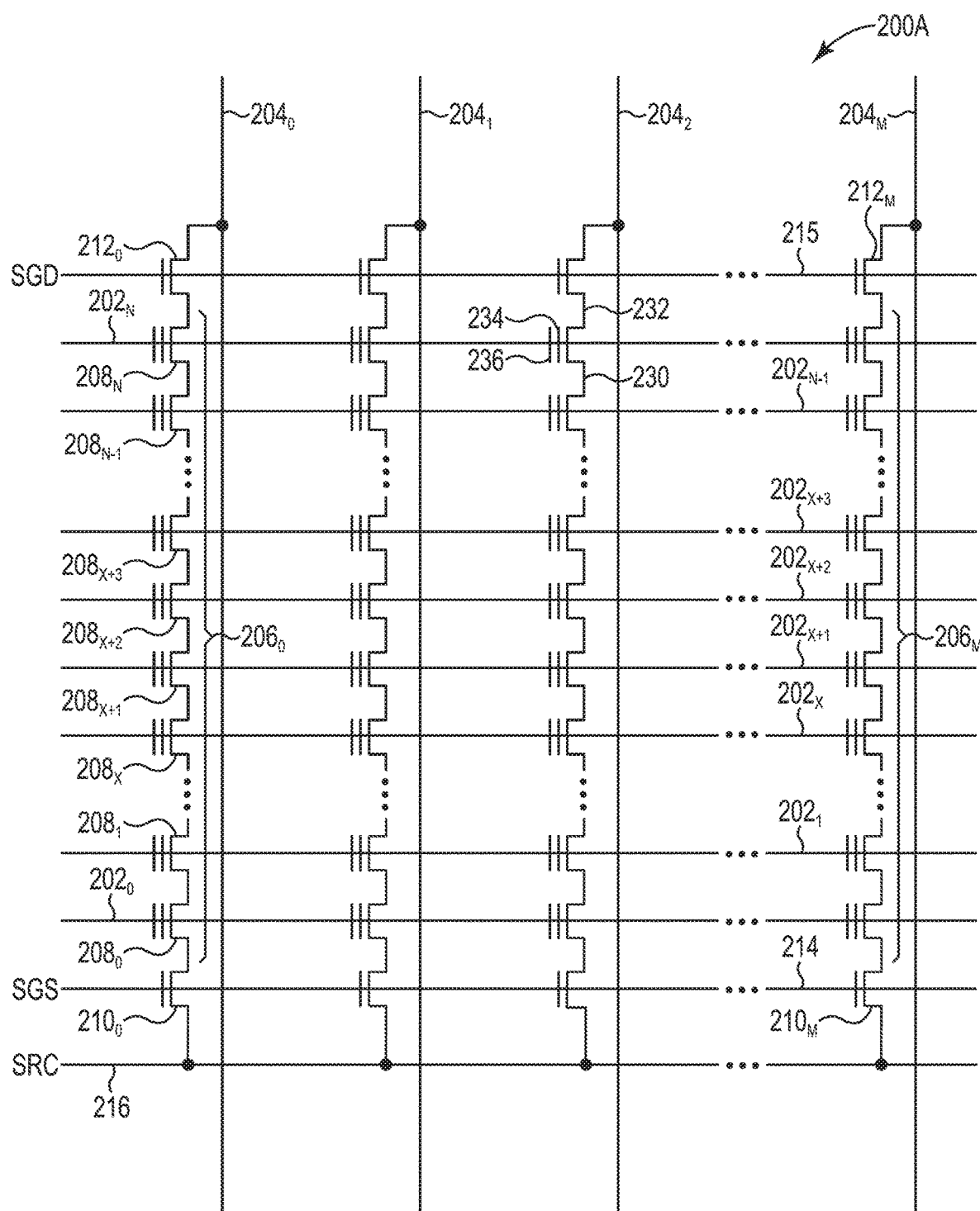

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, strings 206 and bit lines 204 extend in substantially parallel planes. Alternatively, the memory array in FIG. 2A might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2A. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$ $204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 2B:
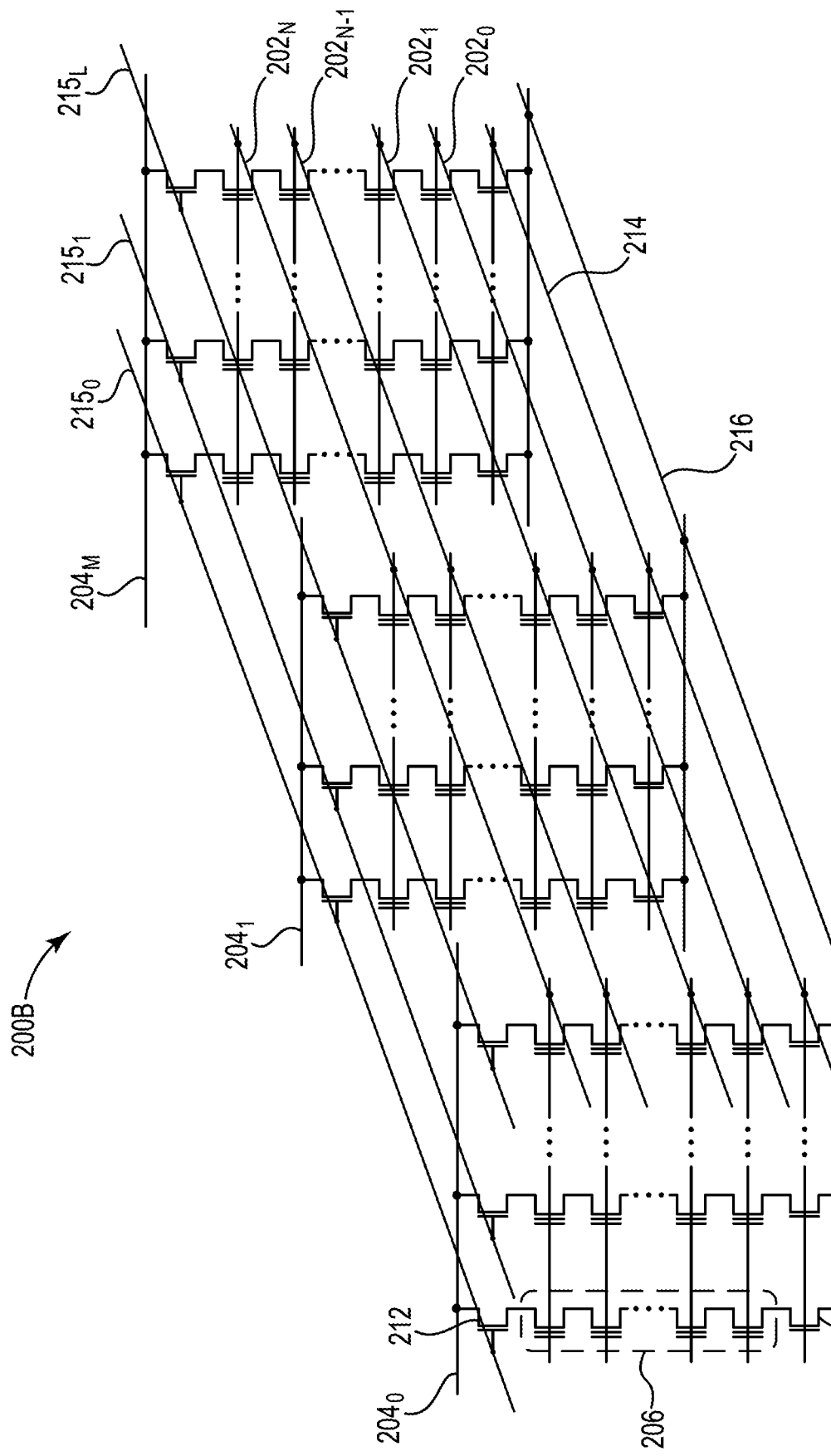

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$ to $204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$ to $215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
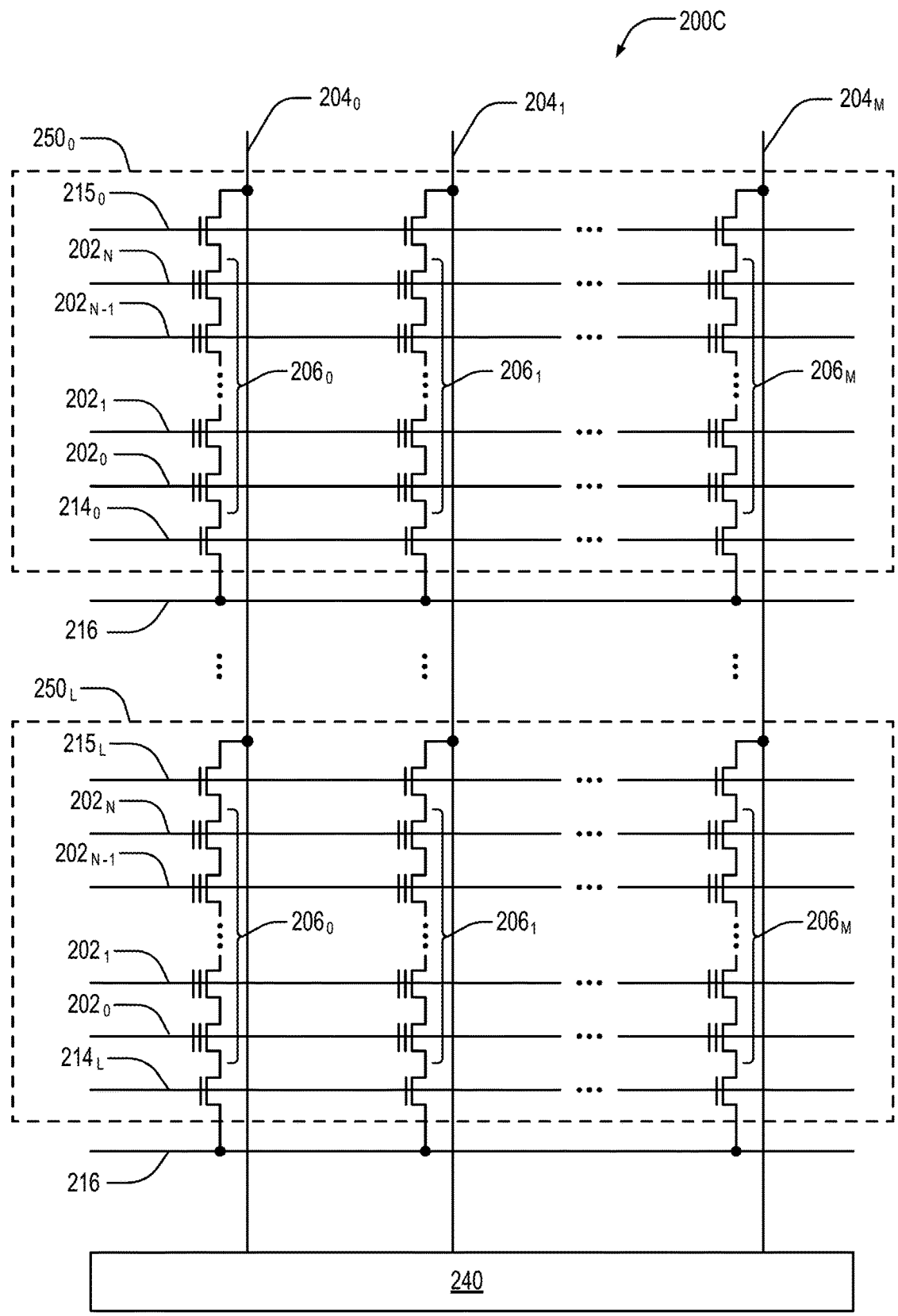

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells 250.

The data lines $204_0$ to $204_M$ may be connected (e.g., selectively connected) to a buffer portion 240, which might be a portion of a page buffer of the memory. The buffer portion 240 might correspond to a memory plane (e.g., the set of blocks of memory cells $250_0$ to $250_L$). The buffer portion 240 might include sensing devices (not shown) for sensing data values indicated on respective data lines 204, and corresponding registers (not shown) for storage of the sensed data values from its corresponding memory plane.

FIG. 2D is a block schematic of a portion of an array of memory cells as could be used in a memory of the type described with reference to FIG. 1. The array of memory cells 260 is depicted to have four memory planes 270 (e.g., memory planes $270_0$ to $270_3$), each in communication with a respective buffer portion 240, which might collectively form a page buffer 272. While four memory planes 270 are depicted, other numbers of memory planes 270 might be commonly in communication with a page buffer 272. Each memory plane 270 is depicted to include L+1 blocks of memory cells 250 (e.g., blocks of memory cells $250_0$ to $250_L$).

Although the examples of FIGS. 2A-2D are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
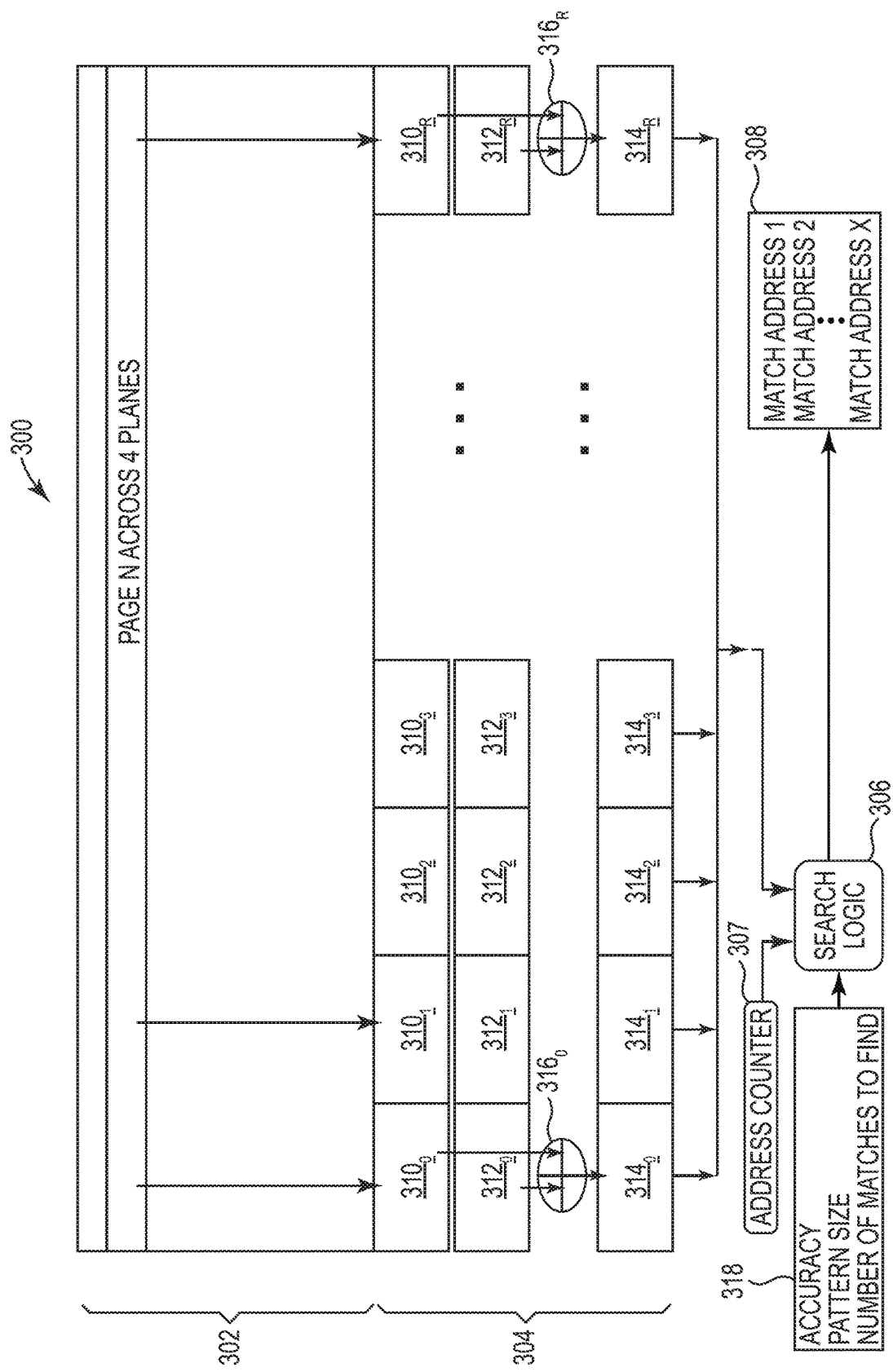
FIG. 3 depicts one example of an internal search function of a memory device.

FIG. 3 depicts one example of an internal search function of a memory device 300. In one example, memory device 300 is of the type described with reference to FIGS. 1-2D. Memory device 300 may include a memory array (e.g., a NAND array) 302, a page buffer 304, search logic 306, address registers 308, and user parameter registers 318. In one example, search logic 306 may include an address counter 307. Memory array 302 may include memory cells grouped into a plurality of pages. Each page may extend across a plurality (e.g., four) planes and include a number of bytes (e.g., 64 kB) equal to the width of the page buffer 304. Page buffer 304 may include first registers $310_0$ to $310_R$, second registers $312_0$ to $312_R$, third registers $314_0$ to $314_R$, and compare logic $316_0$ to $316_R$, where "R" is the width of the page buffer 304.

Each of the first registers $310_0$ to $310_R$, second registers $312_0$ to $312_R$, and third registers $314_0$ to $314_R$ may include a latch, a volatile memory, or another suitable storage device. The first registers $310_0$ to $310_R$ are electrically coupled to the memory array 302. The first registers $310_0$ to $310_R$ and the second registers $312_0$ to $312_R$ are electrically coupled to inputs of compare logic $316_0$ to $316_R$, respectively. The output of compare logic $316_0$ to $316_R$ is electrically coupled to third registers $314_0$ to $314_R$, respectively. The third registers $314_0$ to $314_R$ are electrically coupled to search logic 306. Search logic 306 is electrically coupled to address counter 307, address registers 308, and user parameter registers 318. Search logic 306 may include a controller or other suitable logic circuitry. Address registers 308 and user parameter registers 318 may each include a volatile memory or another suitable storage device.

The first registers $310_0$ to $310_R$ store data read from a page of the memory array 302. The second registers $312_0$ to $312_R$ store a user pattern. The user pattern may be loaded into the second registers $312_0$ to $312_R$ over an I/O interface (not shown) of the memory device 300. In one example, the second registers $312_0$ to $312_R$ store multiple repeating copies of the user pattern in response to a number of bits of the user pattern being less than a number of bits of a page of the memory array. For example, for a 64 kB page width and a 16 kB user pattern, the second registers $312_0$ to $312_R$ store four copies of the user pattern. The compare logic $316_0$ to $316_R$ compares the data stored in the first registers $310_0$ to $310_R$ to the user pattern stored in the second registers $312_0$ to $312_R$, respectively. The third registers $314_0$ to $314_R$ store the comparison results. In one example, the compare logic $316_0$ to $316_R$ may include exclusive OR (XOR) logic. Accordingly, in one example, the comparison results stored in third registers $314_0$ to $314_R$ include a "0" for each matching bit and a "1" for each bit that does not match.

User parameter registers 318 may store user parameters for a search, such as a size of the user pattern, an accuracy setting for identifying matches, and a number of matches to be identified. The search logic 306 is configured to, based on the user parameters, identify addresses of the memory array 302 where the comparison results stored in the third registers $314_0$ to $314_R$ indicate a match between the data read from the page and column of the memory array 302 and the user pattern. In one example, address counter 307 tracks the addresses of the data read from the memory array 302. The search logic 306 may receive the accuracy setting for identifying matches and identify addresses of the memory array 302 where the results stored in the third registers $314_0$ to $314_R$ indicate a match within the accuracy setting. For example, for a 10 kB user pattern and a match accuracy setting of 90%, search logic 306 may identify a match in response to 9 kB of the data stored in a corresponding portion of third registers $314_0$ to $314_R$ indicating a match. The identified addresses (e.g., match address 1, match address 2, . . . match address x) may be stored in address registers 308. The identified addresses may be output to an I/O interface of memory device 300.

To perform a search of memory array 302, the user parameters (e.g., a user pattern size, an accuracy setting for identifying matches, and a number of matches to be identified) may be input to memory device 300 and loaded into user parameter registers 318. In addition, the user pattern may be input to memory device 300 and loaded into the second registers $312_0$ to $312_R$. A search command is then issued to start reading memory array 302 page by page. The data read from a page of memory array 302 is loaded into first registers $310_0$ to $310_R$. Once the data is loaded into first registers $310_0$ to $310_R$, the data is compared to the user pattern stored in second registers $312_0$ to $312_R$ by compare logic $316_0$ to $316_R$ and the results are stored in third registers $314_0$ to $314_R$. During the search, after an initial page of memory array 302 has been read, the first registers $310_0$ to $310_R$ are loaded with data from a following page (e.g., page N+1) of the memory array 302 concurrently with the search logic 306 identifying addresses indicating a match in a previous page (e.g., page N) of the memory array 302. If a match is found (e.g., within the user parameter accuracy setting), search logic 306 stores the address (e.g., page and column) of memory array 302 where the match was found in address registers 308.

As used herein, multiple acts being performed "concurrently" will mean that each of these acts is performed for a respective time period, and each of these respective time periods overlaps, in part or in whole, with each of the remaining respective time periods. In other words, those acts are concurrently performed for at least some period of time.

In one example, memory device 300 includes control logic (not shown in FIG. 3), such as I/O control circuitry 112 of FIG. 1, configured to output the identified addresses stored in the address registers 308 via the I/O interface once each page of the plurality of pages of the memory array 302 has been read. In another example, the control logic is configured to output the identified addresses stored in the address registers via the I/O interface once a single address (e.g., the number of matches to identify is set to one) is identified. In yet another example, the control logic is configured to output the identified addresses stored in the address registers 308 via the I/O interface once a predefined number (e.g., the number of matches to identify is set to the predefined number) of addresses are identified. Once the addresses from address register 308 are output, the data stored at each of the identified addresses in memory array 302 may be read and output. Error correction may be performed on the output data if needed, and the output data may be inspected to determine if each identified match is valid. In one example, in response to an identified match being found to be invalid or in response to a request to search for additional matches, a resume search command may be issued to resume the search of memory array 302.

Figure 4:
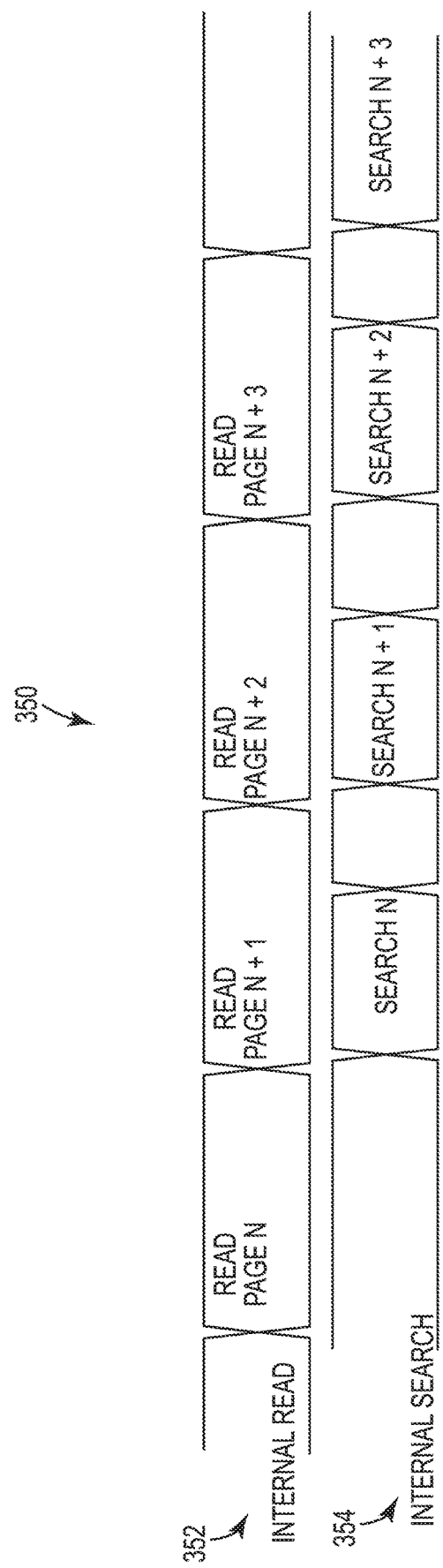
FIG. 4 is a timing diagram illustrating one example of the timing of the internal search function.

FIG. 4 is a timing diagram 350 illustrating one example of the timing of the internal search function of the memory device 300 of FIG. 3. Timing diagram 350 includes an internal read signal 352 and an internal search signal 354. The internal read signal 352 sequentially initiates a read of each page of the memory array (e.g., page N, page N+1, page N+2, page N+3, etc.) to load the data read from each page into first registers $310_0$ to $310_R$. After the data is loaded into the first registers $310_0$ to $310_R$, the data is compared to the user pattern stored in the second registers $312_0$ to $312_R$, and the results are stored in the third registers $314_0$ to $314_R$. The internal search signal 354 initiates a search of the comparison results stored in the third registers $314_0$ to $314_R$ while the next page of the memory array 302 is being read into the first registers $310_0$ to $310_R$. For example, as illustrated in timing diagram 350, page N+1 of memory array 302 is read while the comparison results for page N are searched for matches.

Figure 5A:
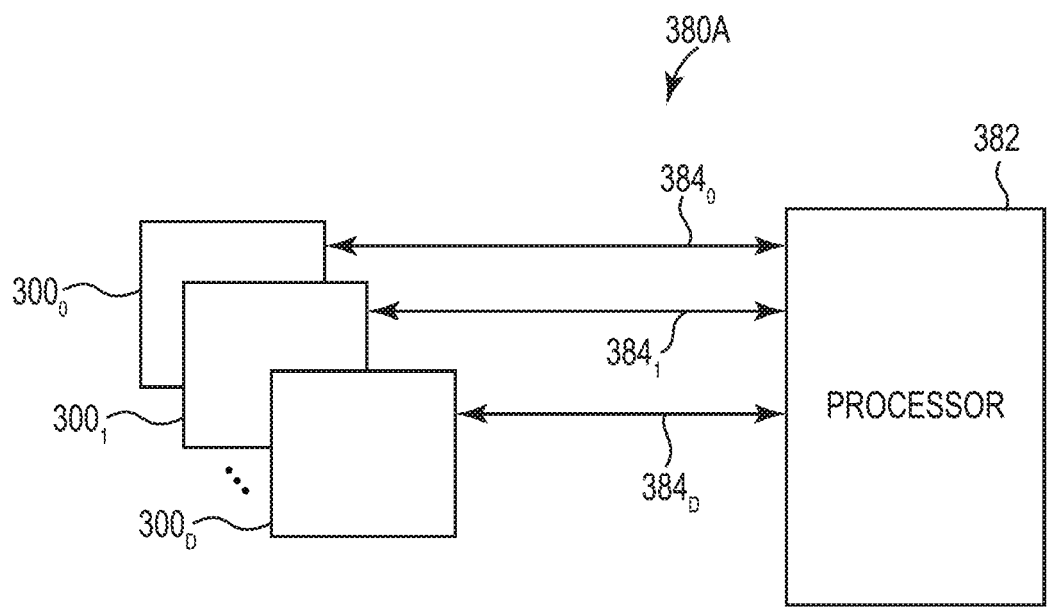
FIGS. 5A-5B are block diagrams illustrating example memory systems.
Figure 5B:
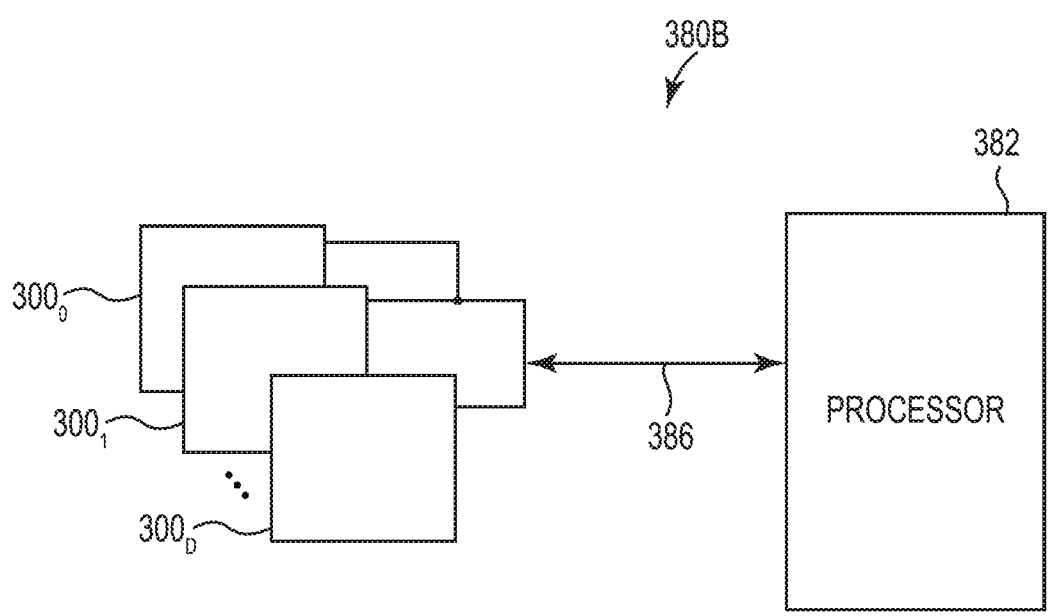

FIGS. 5A-5B are block diagrams illustrating example memory systems 380A and 380B, respectively. Each memory system 380A and 380B includes a plurality of memory devices $300_0$ to $300_D$ and a processor (e.g., an external controller) 382, where "D" is any suitable number (e.g., 16) of memory devices (e.g., memory dies). For memory system 380A of FIG. 5A, each memory device $300_0$ to $300_D$ is communicatively coupled to the processor 382 through a separate channel $384_0$ to $384_D$ (e.g., separate control links 132 and I/O interfaces 134 of FIG. 1), respectively. For memory system 380B of FIG. 5B, each memory device $300_0$ to $300_D$ is communicatively coupled to the processor 382 through a single channel 386 (e.g., single control link and I/O interface).

Each memory device $300_0$ to $300_D$ may include the memory device 300 of FIG. 3. For both memory system 380A and 380B, the processor 382 may load the user parameters and the user pattern to each memory device $300_0$ to $300_D$ and initiate a search of each memory device $300_0$ to $300_D$ in parallel. Since the search is performed internally to each memory device $300_0$ to $300_D$ in parallel, the time for searching within memory system 380A with separate channels $384_0$ to $384_D$ is about equal to the time for searching within memory system 380B with a single channel 386.

Figure 6A:
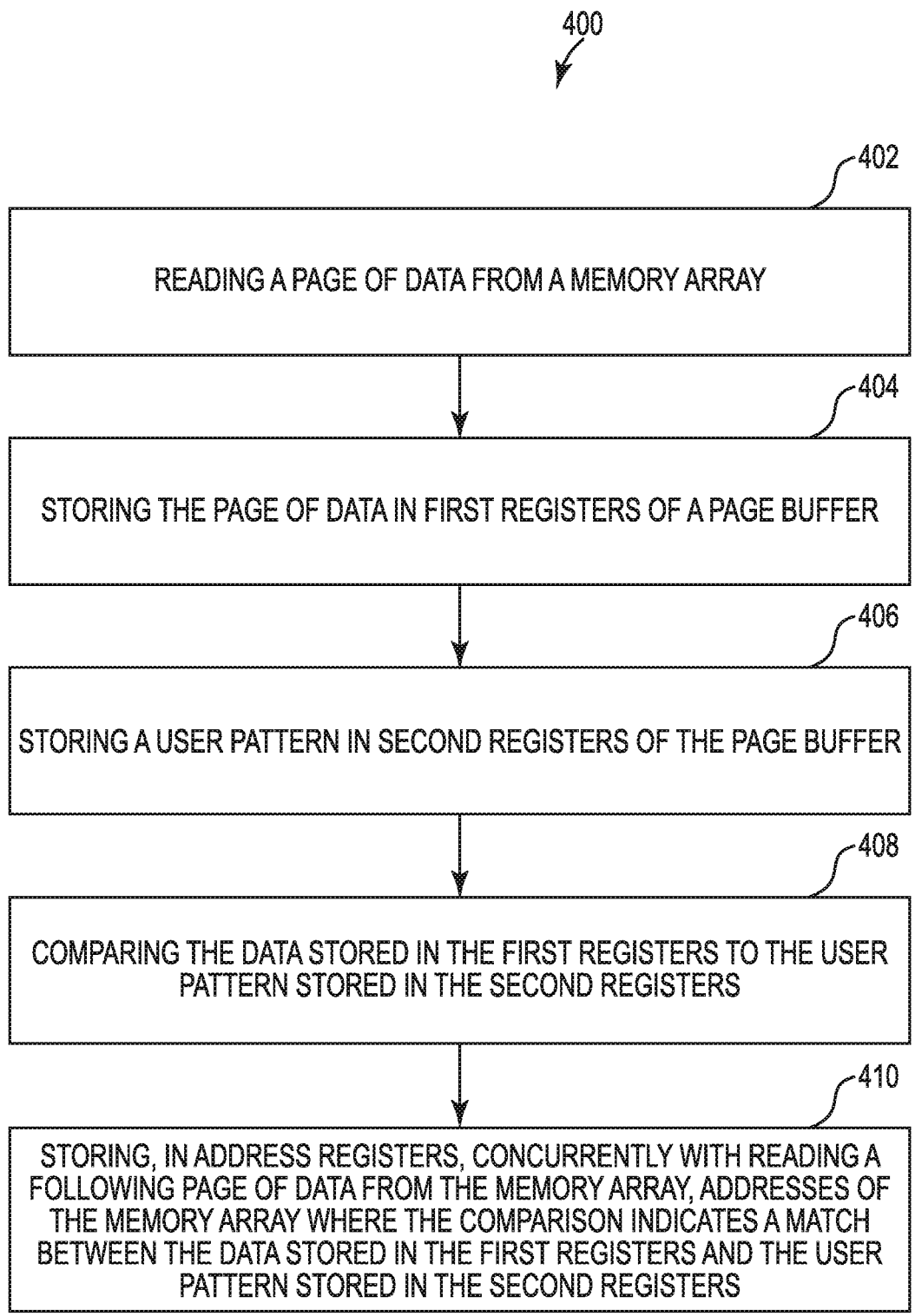
FIGS. 6A-6E are flow diagrams illustrating one example of a method for performing a search within a memory.

FIGS. 6A-6E are flow diagrams illustrating one example of a method 400 for performing a search within a memory. In one example, method 400 may be implemented by memory device 100 of FIG. 1 or memory device 300 of FIG. 3. As illustrated in FIG. 6A, at 402 method 400 includes reading a page of data from a memory array. At 404, method 400 includes storing the page of data in first registers of a page buffer. At 406, method 400 includes storing a user pattern in second registers of the page buffer. At 408, method 400 includes comparing the data stored in the first registers to the user pattern stored in the second registers. In one example, comparing the data stored in the first registers to the user pattern stored in the second registers comprises XORing the data stored in the first registers to the user pattern stored in the second registers. At 410, method 400 includes storing, in address registers, concurrently with reading a following page of data from the memory array, addresses of the memory array where the comparison indicates a match between the data stored in the first registers and the user pattern stored in the second registers.

Figure 6B:
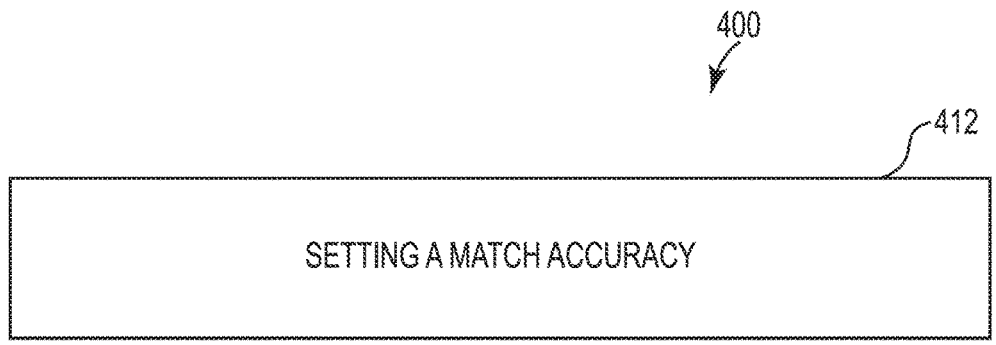
Figure 6C:
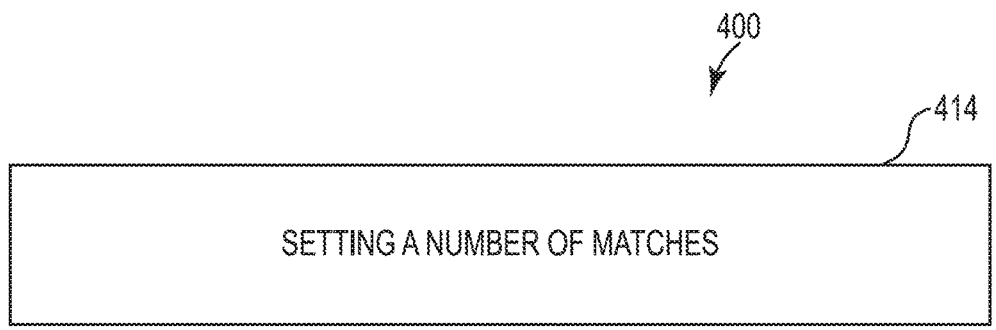
Figure 6D:
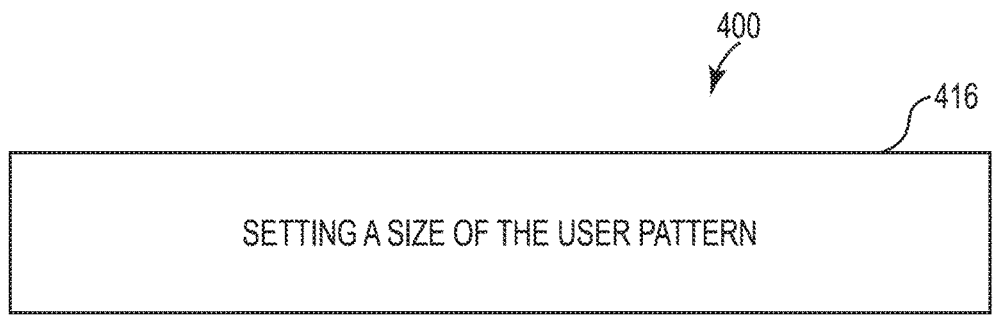
Figure 6E:
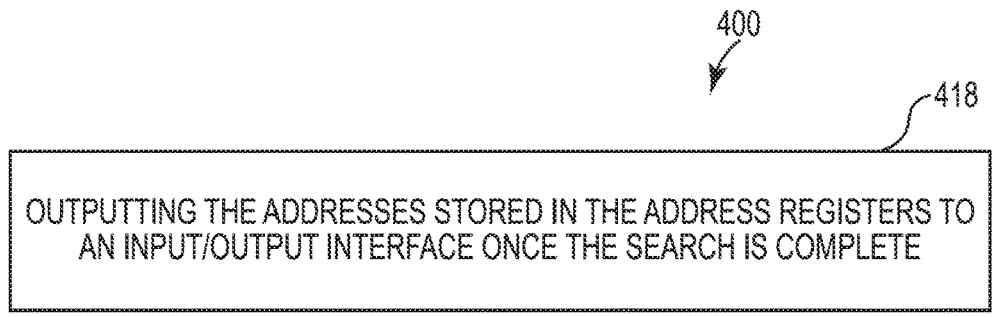

As illustrated in FIG. 6B, at 412 method 400 may further include setting a match accuracy. In this case, storing addresses of the memory array may include storing addresses of the memory array where the comparison indicates a match within the match accuracy. As illustrated in FIG. 6C, at 414 method 400 may further include setting a number of matches. In this case, storing addresses of the memory array may include storing addresses until the number of matches is reached. As illustrated in FIG. 6D, at 416 method 400 may further include setting a size of the user pattern. In this case, storing the user pattern in the second registers may include storing multiple copies of the user pattern in the second registers based on the size of the user pattern. As illustrated in FIG. 6E, at 418 method 400 may further include outputting the addresses stored in the address registers to an input/output interface once the search is complete.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory comprising:
   a memory array comprising a plurality of pages;
   a page buffer comprising:
      first registers to store data read from a page of the memory array;
      second registers to store a user pattern;
      compare logic to compare the data stored in the first registers to the user pattern stored in the second registers; and
      third registers to store the comparison results; and
   search logic configured to identify addresses of the memory array where the comparison results stored in the third registers indicate a match between the data read from the page and column of the memory array and the user pattern,
   wherein the first registers are loaded with data from a following page of the memory array concurrently with the search logic identifying addresses indicating a match in a previous page of the memory array.

2. The memory of claim 1, wherein the compare logic comprises XOR logic.

3. The memory of claim 1, wherein the second registers store multiple repeating copies of the user pattern in response to a number of bits of the user pattern being less than a number of bits of a page of the memory array.

4. The memory of claim 1, further comprising:
   address registers to store the identified addresses.

5. The memory of claim 4, further comprising:
   an input/output interface to load the user pattern into the second registers and to output the identified addresses from the address registers.

6. The memory of claim 5, further comprising:
   control logic configured to output the identified addresses stored in the address registers via the input/output interface once each page of the plurality of pages of the memory array has been read.

7. The memory of claim 5, further comprising:
   control logic configured to output the identified addresses stored in the address registers via the input/output interface once a single address is identified.

8. The memory of claim 5, further comprising:
   control logic configured to output the identified addresses stored in the address registers via the input/output interface once a predefined number of addresses are identified.

9. The memory of claim 1, wherein the search logic comprises an address counter to track the addresses of the data read from the memory array.

10. A memory comprising:
    a plurality of NAND memory arrays, each NAND memory array of the plurality of NAND memory arrays comprising:
       a page buffer comprising:
          first registers to store a page of data read from that NAND memory array;
          second registers to store a user pattern;
          XOR logic configured to XOR the data stored in the first registers to the data stored in the second registers; and
          third registers to store the results of the XOR logic;
       search logic configured to identify addresses of that NAND memory array where the results stored in the third registers indicates a match between the data read from that NAND memory array and the user pattern; and address registers to store the identified addresses; and a processor coupled to each NAND memory array of the plurality of NAND memory arrays, the processor configured to load the user pattern and initiate a search of each NAND memory array of the plurality of NAND memory arrays in parallel.

11. The memory of claim 10, further comprising:

at least one user parameter register to store a size of the user pattern, an accuracy setting for identifying matches, and a number of matches to be identified.

12. The memory of claim 10, wherein the search logic receives an accuracy setting for identifying matches and identifies addresses of that NAND memory array where the results stored in the third registers indicate a match within the accuracy setting.

13. The memory of claim 10, wherein the search logic is configured to identify addresses for matches from the results stored in the third registers for a previous page of data read from the NAND memory array concurrently with the first registers being loaded with a next page of data read from the NAND memory array.

14. The memory of claim 10, wherein the processor is coupled to the plurality of NAND memory arrays through a single channel.

15. The memory of claim 10, wherein the processor is coupled to each NAND memory array of the plurality of NAND memory arrays through a separate channel.

16. A method for performing a search within a memory, the method comprising:

reading a page of data from a memory array;

storing the page of data in first registers of a page buffer;

storing a user pattern in second registers of the page buffer;

comparing the data stored in the first registers to the user pattern stored in the second registers; and storing, in address registers, concurrently with reading a following page of data from the memory array, addresses of the memory array where the comparison indicates a match between the data stored in the first registers and the user pattern stored in the second registers.

17. The method of claim 16, wherein comparing the data stored in the first registers to the user pattern stored in the second registers comprises XORing the data stored in the first registers to the user pattern stored in the second registers.

18. The method of claim 16, further comprising:

setting a match accuracy, wherein storing addresses of the memory array comprises storing addresses of the memory array where the comparison indicates a match within the match accuracy.

19. The method of claim 16, further comprising:

setting a number of matches, wherein storing addresses of the memory array comprises storing addresses until the number of matches is reached.

20. The method of claim 16, further comprising:

setting a size of the user pattern;

wherein storing the user pattern in the second registers comprises storing multiple copies of the user pattern in the second registers based on the size of the user pattern.

21. The method of claim 16, further comprising:

outputting the addresses stored in the address registers to an input/output interface once the search is complete.

* * * * *